United States Patent [19]

Goebel et al.

[11] Patent Number: 4,967,316
[45] Date of Patent: Oct. 30, 1990

[54] ELECTRIC CIRCUIT UNIT

[75] Inventors: Ulrich Goebel, Reutlingen; Roland Gerstner, Wernau; Walter Roethlingshoefer, Reutlingen; Dietrich Bergfried, Boeblingen; Michael Krapp, Reutlingen, all of Fed. Rep. of Germany

[73] Assignee: Robert Bosch GmbH, Stuttgart, Fed. Rep. of Germany

[21] Appl. No.: 417,294

[22] Filed: Oct. 5, 1989

[30] Foreign Application Priority Data

Nov. 2, 1988 [DE] Fed. Rep. of Germany ....... 3837206

[51] Int. Cl.$^5$ .............................................. H05K 9/00
[52] U.S. Cl. ..................................... 361/424; 174/51; 174/261; 333/185
[58] Field of Search ............... 361/386, 383, 387, 388, 361/395, 397, 400, 405, 410, 424, 523, 526, 535, 541; 174/35 R, 51, 259, 260, 261; 333/24 C, 181, 185

[56] References Cited

U.S. PATENT DOCUMENTS

| 4,258,411 | 3/1981 | Sherman | 361/387 |
| 4,641,224 | 2/1987 | Reimer | 174/35 R |
| 4,675,784 | 6/1987 | Dahlberg | 361/387 |
| 4,729,809 | 3/1988 | Dery | 174/259 |
| 4,747,019 | 5/1988 | Ito | 361/424 |
| 4,791,391 | 12/1988 | Linnell | 333/185 |
| 4,795,991 | 1/1989 | Saito | 333/181 |
| 4,861,941 | 8/1989 | Kubo | 174/35 R |
| 4,912,604 | 3/1990 | Vaisanen | 361/424 |

Primary Examiner—Gerald P. Tolin
Attorney, Agent, or Firm—Frishauf, Holtz, Goodman & Woodward

[57] ABSTRACT

An electrical circuit unit, particularly for motor vehicles, features a grounded housing (1) and a printed circuit board (2) which, for protection against incoming and outgoing radiation of electrical noise, is short-circuited at high frequencies to the grounded housing. For this purpose, a noise suppression capacitor (6) on the PC board (2) is connected in series to a second capacitor. This second capacitor is formed by a metallized surface (8) on the board (2) and a metal-filled adhesive, as a first plate, a metal inner surface (11) of the housing (1) as a second plate, and an intermediate passivation or eloxal layer serving as a dielectric (13). The metal-filled adhesive acts to electrically bridge most of the gap between the metallized surface (8) and the housing surface (11), thereby capacitively coupling the metal-filled adhesive to the housing (1) and increasing the capacitance.

6 Claims, 1 Drawing Sheet

ELECTRIC CIRCUIT UNIT

The present invention relates generally to electrical devices in which electromagnetic noise is reduced by coupling the circuit, inside a housing, to the housing or other external element, and, more particularly, to an improved circuit unit in which a metal-filled elastic material is used to improve the capacitive coupling of the circuit board to the metallic or metal-coated housing.

BACKGROUND

It is conventional in electrical control units to reduce electrical noise by providing on the printed circuit (PC) board noise suppression capacitors, in the form of Surface-Mounted Devices (SMD's) which are soldered to the associated printed conductor tracks on the board. The tracks which serve as the grounding terminal generally have soldered to them an S-shaped spring, a portion of which grips the edge of the PC board, and a free end of which rests under spring tension against a metal housing. This structure has the disadvantages that the springs, as mechanical elements, consume space and, as they age, degrade the spring contact to the metal housings, particularly if aluminum. They also present an excessively long path between noise suppression capacitor and grounding element and thus can radiate noise signals.

It is also known to design electrical control devices in which the PC board is glued onto a grounding plate or into a housing, e.g. of aluminum. The grounding plate and housing can additionally serve as cooling elements or heat sinks/radiators. In the case of PC boards of ceramic or glass, the adhesive must have a relatively large minimum thickness, due to the differing thermal coefficients of expansion of the ceramic or glass, on the one hand, and the aluminum housing, on the other hand, and further due to the need to compensate for manufacturing tolerances. The PC board is provided on its underside in the adhered region, with a relatively broad conductive track to which is connected, e.g. by through-plating, one side of the noise suppression capacitor mounted on the upper side of the PC board. Since the adhesive separates the aluminum element (grounding plate or housing) from the conductive track or patch, a capacitor is formed between the patch and the grounding plate or housing. However, in these prior art devices, the capacitance thus formed is very small, due to the relatively large distance between the two capacitor electrodes or plates (the patch an the grounding plate or housing), and resulting capacitance is too small to be operative for noise reduction certain frequency ranges, particularly the important FM frequency band.

THE INVENTION

It is a primary object of the present invention to provide an electrical circuit unit which, by simple means, couples the circuit at high frequencies to ground and thus overcomes the limitations of the prior art solutions to the electromagnetic noise suppression problem.

Briefly, the present invention increases the capacitance formed by the PC board and housing by reducing the effective distance between the two capacitor plates. This is accomplished by putting bits of metal in the adhesive which fills the interstices between board and housing. A dielectric is still provided by a coating or surface layer formed on the metal.

This has the advantages that (1) the capacitor formed by the board/housing combination can readily be connected in series with the noise suppression capacitor mounted on the board, and (2) this effectively couples the circuit to ground and so increases the operative effect of the noise suppression capacitor that an outstanding high-frequency coupling of the circuit to ground results, without requiring any additional mechanical elements such as the springs used in the prior art.

Additional features are also provided. It is particularly advantageous to use, as the dielectric between the conductive patch/metal-filled-adhesive, on the one hand, and the grounding plate or housing, on the other hand, a passivation layer on the metal and/or an eloxal layer. If the metal is aluminum, its surface oxidation layer can serve as the passivation layer.

BRIEF FIGURE DESCRIPTION

The single FIGURE a longitudinal cross-section through the electrical circuit unit of the present invention.

DETAILED DESCRIPTION

Figure 1:
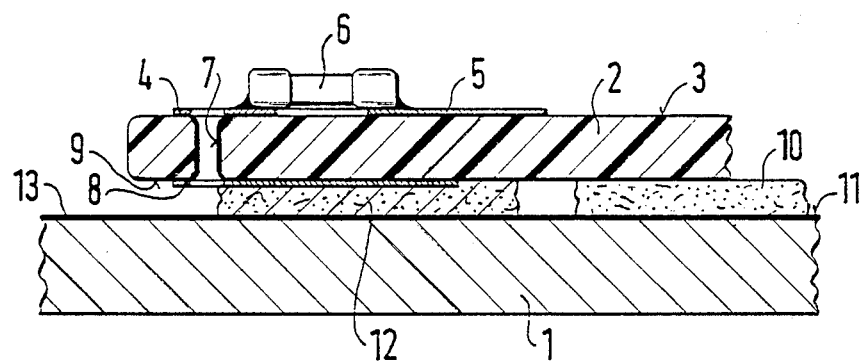

The electrical circuit unit has a housing 1 of metal, e.g. of aluminum. Housing 1 encloses a printed circuit board 2. The board has an upper surface 3 with conductive tracks 4 and 5, to which a noise-suppression capacitor 6 is secured, by Surface-Mounted-Device (SMD) technology, mechanically and in electrically conductive contact. A plated-through hole 7 is provided in board 2 in the middle of a conductive track 4. The plating within hole 7 extends as a broad conductive layer 8 on the undersurface 9 of board 2. Board 2 is adhered to an inner or wall 11 of housing 1 by an adhesive (10), preferably a flexible adhesive such as silicone adhesive Q5-8401 from Dow Corning or a flexible epoxy adhesive from AIT, e.g. no. M 7616. The space between plated surface 8 and inner wall 11 is filled with an electrically conductive adhesive 12 containing metal, for example silver. A suitable adhesive 12 is again a silicone adhesive, for example Cho Bond 1029 (conductive silicone adhesive) from Chomerics or SLM 31 202 from Wacker Chemicals. Alternatively, an electrically conductive paste can be used.

Adhesive or paste 12, together with plated surface 8, to which it is short-circuited, forms one side of a capacitor, the other side of which is formed by aluminum housing 1. The dielectric of the capacitor is a passivation layer 13 on inner wall 11, which in the case of aluminum may be the aluminum oxide surface layer which forms automatically. Dielectric 13 can also comprise an eloxal layer. The term "eloxal" refers to electrolytic oxidation of metals, e.g. in an oxalic or sulfuric acid bath to produce an anodic or oxide coating on the surface thereof. In other cases, layer 13 can be a layer of paint or a thin plastic resin coating.

By reason of the thinness of dielectric layer 13, the sides 8, 12 and 1 of the capacitor are brought so close together that the capacitance is a multiple of that of the prior art arrangement. The thickness of the adhesive layer between plated surface 8 and inner wall 11 requires a certain spacing, but this is bridged over electrically by the metal filling in adhesive 12, forming a plastic or elastic mass. The metal-filled adhesive 12 is capacitively coupled to housing 1.

The capacitor formed by elements 8, 12, 13 and 1 is in series with noise-suppression capacitor 6, so the circuit of the electrical device is, for high frequencies, short-circuited to housing 1 which forms a ground.

In a variation of the embodiment shown, the housing can be provided with a base plate to which the printed circuit board is adhered.

The base plate can simultaneously serve as a cooling element, and so can the housing, for that matter. Further, the printed circuit board can be made in the conventional fashion from plastic resin or can be a ceramic or glass plate. The plating or metallized layer on the underside of the circuit board can comprise gold, silver or one of the other known plating metals which provides an electrically good-conducting result with the metal provided in the adhesive.

The housing can also comprise other metals, e.g. lacquered steel sheet.

In the case of a circuit unit designed for use in a motor vehicle, the housing can be made of plastic and be provided, at least in the region adjacent to the metallized surface 8, with an electrically conductive metal coating, which is short-circuited to the chassis ground of the motor vehicle.

We claim:

1. An electrical circuit unit having
   a grounded portion (1);
   a printed circuit board (2) having an upperside (3) and an underside (9), and mounted in said grounded portion;
   electrical components (6) mounted on said board (2);
   elastic material (10) securing said board underside (9) to the unit;
   an electrically conducting layer (8) at least partially covering said board underside (9) and connected to one of said electrical components which forms a capacitor (6);
   wherein, in accordance with the invention, an additional elastic material (12) is filled with an electrically conductive metal (13);
   said grounded portion (1) and said electrically conductive metal are capacitively coupled together, said elastic material (12) and metal electrically bridging a gap defined between said grounded portion (1) and said conducting layer (8) on said printed circuit board.

2. An electrical circuit unit according to claim 1 further comprising a passivation layer (13) on said grounded portion, serving as a dielectric in a capacitor formed by said metal-filled elastic material, said passivation layer, and said grounded portion 3. An electrical circuit unit according to claim 1, further comprising an eloxal layer (13) on said grounded portion, serving as a dielectric in a capacitor formed by said metal-filled elastic material, said passivation layer, and said grounded portion.

4. An electrical circuit unit according to claim 1, wherein said grounded portion forms a housing (1) of the unit; said housing has at least one electrically conductive metal region; and said conductive region is connected by said elastic material (12) and metal to said printed circuit board (2) and layer (8).

5. An electrical circuit unit according to claim 1, wherein said grounded portion forms a cooling plate of the unit; and said cooling plate is connected by said elastic material (12) and metal to said printed circuit board (2) and layer (8).

6. An electrical circuit unit according to claim 1 wherein the additional elastic material (12) is a paste.

* * * * *